United States Patent
Yang et al.

(10) Patent No.: US 6,653,735 B1
(45) Date of Patent: Nov. 25, 2003

(54) CVD SILICON CARBIDE LAYER AS A BARC AND HARD MASK FOR GATE PATTERNING

(75) Inventors: Chih Yuh Yang, San Jose, CA (US); Douglas Bonser, Austin, TX (US); Pei-Yuan Gao, San Jose, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/209,447

(22) Filed: Jul. 30, 2002

(51) Int. Cl.[7] .......................... H01L 23/48; H01L 23/52
(52) U.S. Cl. ......................... 257/758; 257/759
(58) Field of Search ................. 257/758, 759; 438/710, 712

(56) References Cited

U.S. PATENT DOCUMENTS 5,721,090 A * 2/1998 Okamoto et al.
6,025,273 A * 2/2000 Chen et al.
RE37,896 E * 10/2002 Tomida et al.
6,566,757 B1 * 5/2003 Banerjee et al.

* cited by examiner

*Primary Examiner*—Stephen D. Meier
(74) *Attorney, Agent, or Firm*—Foley & Lardner

(57) ABSTRACT

A BARC comprising materials having a lower pinhole density than that of silicon oxynitride and materials having a coefficient of thermal expansion that is closer to the coefficient of thermal expansion of polysilicon than that of amorphous carbon is employed to reduce deformation of a pattern to be formed in a patternable layer. The patternable layer is formed over a substrate. A multi-layered anti-reflective coating is formed over the patternable layer. A photoresist pattern is formed on the coating. The coating may comprise an amorphous carbon layer formed over the patternable layer and a SiC layer having a lower pinhole density than the pinhole density of SiON formed over the amorphous carbon layer. The coating may also be formed over a polysilicon layer and comprise a thermal expansion buffer layer having a coefficient of thermal expansion that is closer to the coefficient of thermal expansion of polysilicon than that of amorphous carbon.

3 Claims, 4 Drawing Sheets

US 6,653,735 B1

CVD SILICON CARBIDE LAYER AS A BARC AND HARD MASK FOR GATE PATTERNING

BACKGROUND OF THE INVENTION

1. Field of the Invention

The present invention relates, generally, to integrated circuit fabrication and, in preferred embodiments, to a bottom anti-reflective coating and hard mask for gate patterning and a method for forming the same.

2. Description of Related Art

The escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with minimal spacing between conductive lines. The increasing demands for high density impose correspondingly high demands on photolithographic techniques.

During the manufacture of a semiconductor device, light from a stepper is passed through a mask and the pattern transferred to the underlying photoresist layer. However, when the substrate underlying the photoresist layer is highly reflective, for example metal and polysilicon layers, light reflections can destroy the pattern resolution through several mechanisms, including off-normal incident light reflected back into photoresist that is intended to be masked, incident light reflected off device features that exposes "notches" in the photoresist, and thin film interference effects that lead to linewidth variations as a result of photoresist thickness changes are caused by irregular wafer topography.

Conventional photolithographic techniques employed during various phases in the manufacture of semiconductor devices involve the formation of an anti-reflective coating (ARC), also characterized as an anti-reflective layer (ARL), typically positioned between a semiconductor substrate and a photoresist material. Conventional ARCs are designed, by appropriate adjustment of variables such as composition, deposition conditions and reaction conditions, to exhibit the requisite optical parameters to suppress multiple interference effects caused by the interference of light rays propagating in the same direction due to multiple reflections in the photoresist film. The effective use of an ARC enables patterning and alignment without disturbance caused by such multiple interference, thereby improving line width accuracy and alignment.

It has been found that some line width variations are due to the inability of the ARC to reduce reflective layer reflectivity to a minimum. These reflectivity problems have been addressed by the use of bottom anti-reflective coatings (BARCs) underneath the resists.

In some applications, the BARC serves two functions during semiconductor memory manufacturing: (1) as a hard mask during self-aligned etch (SAE) and during self-aligned-source etch; and (2) as a bottom anti-reflective layer for photolithography at second gate masking.

Silicon oxynitride (SiON) by itself has been used as a BARC material. However, the thickness of SiON required to perform the function of a good hard mask is too thick to minimize reflectivity. For example, a typical thickness of a SiON BARC may be 100 nm. This thickness may result in non-uniform line width. The non-uniform line width is a result of lensing reflections of light into the photoresist from undulations in the topography of reflective layers under the BARC that are not completely phase cancelled by the BARC. Consequently, a second anti-reflective layer has been used in combination with a SiON layer to improve the performance of the BARC as both a hard mask and a bottom anti-reflective layer for photolithography.

FIG. 1 shows a double layer type BARC currently used in semiconductor device fabrication. Semiconductor device 100 has a substrate 102. A polysilicon layer 104 with a high reflectivity is formed on substrate 102. The polysilicon layer 104 is to be etched using the BARC as a hard mask. The BARC comprises an amorphous carbon layer 106 and a SiON layer 108. The amorphous carbon layer 106 is formed on top of the polysilicon layer 104. The SiON layer 108 is formed on top of the amorphous carbon layer 106. A photoresist pattern 110 is formed on top of the SiON layer 108 which defines, for example, a line pattern.

A double layer type BARC like that shown in FIG. 1 has the advantages of allowing the thickness of the anti-reflective layer to be appropriately adjusted to lower the reflectivity and, in addition, allowing the double layer type anti-reflective layer to function as a hard mask for use in an etching process.

However, there are also accompanying disadvantages of the double layer type anti-reflective layer structure shown in FIG. 1. One disadvantage of the semiconductor device 100 shown in FIG. 1 is that thin nitride layers such as SiON layer 108 are prone to pinhole defects that may affect the reliability of the semiconductor device. One common cause of pinhole defects in a SiON layer is outgassing during the chemical vapor deposition (CVD) process used to form the SiON layer. This outgassing creates localized non-uniformity of the plasma used in the CVD process which results in pinholes in the SiON layer. The pinholes may allow etchant to pass through the SiON layer and contact the amorphous carbon layer during photoresist etching. In addition, nitrogen dopant provided in the amorphous carbon to improve the etch selectivity of the amorphous carbon relative to polysilicon, may contaminate the photoresist. This may prevent the photoresist from being removed during the development process and may result in defects in the pattern formed on the polysilicon layer.

Another disadvantage of the semiconductor device 100 shown in FIG. 1 is that there exists a large compressive stress in the amorphous carbon layer 106 that results from large differences in coefficients of thermal expansion (CTE) between the amorphous carbon layer 106 and the polysilicon layer 104. Because the polysilicon layer 104 contracts to a different degree than the amorphous carbon layer 106 during the semiconductor device fabrication process, the amorphous carbon layer 106 experiences a permanent state of compressive stress. This stress may cause the patterned amorphous carbon to delaminate from the underlying polysilicon and take on a deformed pattern. When the patterned amorphous carbon is subsequently used as a hard mask to pattern the polysilicon layer 104, the deformed pattern will be transferred to the polysilicon layer 104.

These effects of the polysilicon layer etching process are undesirable, as they make it difficult to control the critical dimensions of the device features. Thus, the semiconductor device may be rejected during a final inspection step due to the deformed pattern on the polysilicon layer.

SUMMARY OF THE DISCLOSURE

Embodiments of the invention pertain to a semiconductor device having a multi-layered anti-reflective coating and a method for fabricating the same. In accordance with a first preferred embodiment of the invention, a patternable layer is formed over a substrate. An anti-reflective coating is formed over the patternable layer. The anti-reflective coating includes an amorphous carbon layer formed over the patternable layer. The anti-reflective coating further includes a SiC layer formed over the amorphous carbon layer. A photoresist pattern is formed over the SiC layer. The SiC layer has a lower pinhole density than the pinhole density of silicon oxynitride. Thus, contamination of the photoresist by components of the amorphous carbon layer is reduced. Further, during the etching process, there is a reduction in undesired etching of the amorphous carbon layer due to etchant passing through a large number of pinhole defects in a silicon oxynitride layer.

In accordance with a second preferred embodiment of the invention, a polysilicon layer is formed over a substrate. The polysilicon layer is characterized by a first CTE. An anti-reflective coating is formed over the polysilicon layer. The anti-reflective coating includes a SiC layer formed over the polysilicon layer. The anti-reflective coating further includes a SiON layer formed over the SiC layer. A photoresist pattern is formed over the SiON layer. The SiC layer is characterized by a second CTE. The CTE of the SiC layer is closer to the CTE of the polysilicon layer than is a CTE of amorphous carbon. Thus, compressive stress is reduced in the SiC layer due to a closer match between the CTEs of the SiC layer and the polysilicon layer and, therefore, deformation of the SiC layer is reduced. This results in a reduction in the deformation of the pattern that will be transferred to the polysilicon layer.

In accordance with a third preferred embodiment of the invention, a polysilicon layer is formed over a substrate. The polysilicon layer is characterized by a first CTE. An anti-reflective coating is formed over the polysilicon layer. The anti-reflective coating includes a SiC buffer layer formed over the polysilicon layer. The anti-reflective coating further includes an amorphous carbon layer formed over the SiC buffer layer. The anti-reflective coating further includes a third layer formed over the amorphous carbon layer. A photoresist pattern is formed over the third layer. The SiC buffer layer is characterized by a second CTE. The second CTE is closer to the CTE of the polysilicon layer than is a CTE of amorphous carbon. Thus, compressive stress is reduced in the amorphous carbon layer due to the presence of the SiC buffer layer. Compressive stress is also reduced in the SiC buffer layer due to a closer match between the CTEs of the SiC buffer layer and the polysilicon layer and, therefore, deformation of the SiC buffer layer will be reduced. The third layer may be a SiON layer or an additional SiC layer. When the third layer is an additional SiC layer, it has the further advantages of a lower pinhole density, including reduced contamination of the photoresist pattern by components of the amorphous carbon layer and reduced etching of the amorphous carbon layer due to etchant passing through pinhole defects.

These and other features and advantages of embodiments of the invention will be apparent to those skilled in the art from the following detailed description of embodiments of the invention, when read with the drawings and appended claims.

BRIEF DESCRIPTION OF THE DRAWINGS

Referring now to the drawings in which like reference numbers represent corresponding parts throughout.

DETAILED DESCRIPTION OF PREFERRED EMBODIMENTS

Figure 1:
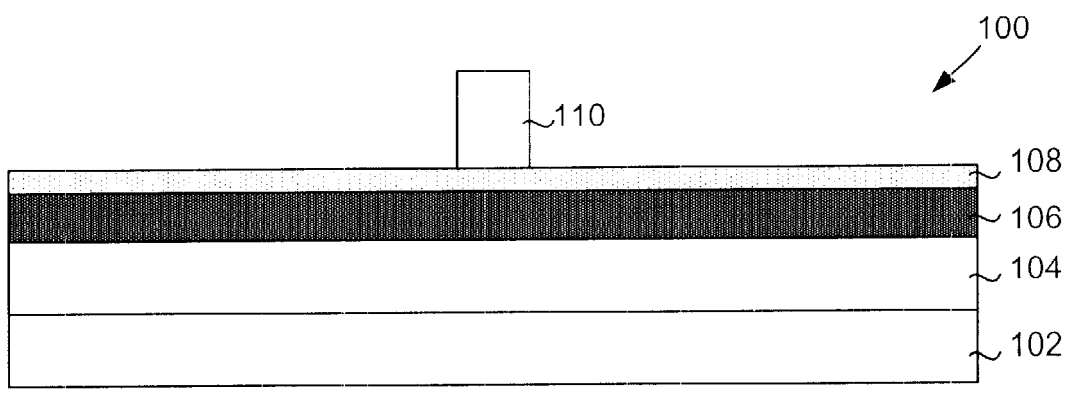
FIG. 1 illustrates a cross-section view of a semiconductor device employing a double layer type anti-reflective coating.

In the following description of preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the invention.

As will be apparent to one of ordinary skill in the art, the processes and structures described below do not necessarily form a complete process flow for manufacturing such devices. However, the present invention can be used in conjunction with conventional technology currently employed in the art, for example integrated circuit fabrication methodology, and, consequently, only so much of the commonly practiced processes are included here as are necessary for an understanding of the present invention. As employed throughout the disclosure and claims, the term "substrate" includes, for example, a semiconductor substrate per se or an epitaxial layer formed on a suitable semiconductor substrate. Finally, the drawing figures representing cross-sections of portions of a semiconductor device during fabrication processing are not drawn to scale, but instead are drawn as to best illustrate the features of the present invention.

Embodiments of the present invention will now be described with reference to FIGS. 2, 4 and 6, which show, in simplified, cross-sectional, schematic fashion, illustrative, but not limiting, embodiments of the present invention comprising a process performed on a semiconductor wafer substrate-based workpiece and wherein similar reference numerals are used throughout to denote similar features.

Figure 2:
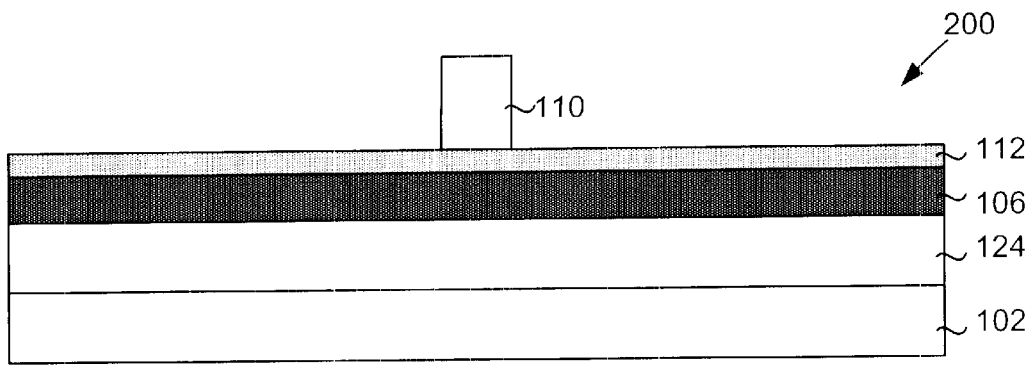
FIG. 2 illustrates a cross-section view of a semiconductor device employing a multi-layered anti-reflective coating having a SiC layer deposited over an amorphous carbon layer in accordance with a first preferred embodiment of the invention.

As illustrated by semiconductor device 200 shown in FIG. 2, according to a first preferred embodiment of the present invention, a patternable layer 124 is formed over a substrate 102 using suitable deposition techniques. The patternable layer 124 may be, for example, a polysilicon or metal layer. A multi-layered anti-reflective coating is formed over the patternable layer 124. During subsequent stages of the semiconductor device fabrication process, the multi-layered anti-reflective coating is used both as a hard mask and as a bottom anti-reflective layer for photolithography.

The multi-layered anti-reflective coating comprises an amorphous carbon layer 106 formed on the patternable layer 124 using any suitable deposition technique. A SiC layer 112 of the anti-reflective coating is formed over the amorphous carbon layer 106 using any suitable deposition technique, including, but not limited to, Plasma Enhanced Chemical Vapor Deposition (PECVD). The pinhole density of the SiC layer 112 formed over the amorphous carbon layer 106 in this manner is lower than the pinhole density of a SiON layer formed over the amorphous carbon layer 106 by the same process.

A photoresist pattern 110 to be used in the photolithographic patterning process is formed over the SiC layer 112. Photoresist 110 is conventionally used to pattern desired features, such as gates, holes, and lines, onto another surface. Photoresist 110 may be deposited onto SiC layer 112 by any conventional deposition process, including, but not limited to, a spin-on process.

Thus, the preferred embodiment of the invention shown in FIG. 2 stands in contrast to the method discussed above in relation to FIG. 1. In semiconductor device 100 (shown in FIG. 1), the SiON layer 108 has a large pinhole density that may result in contamination of the photoresist and unwanted etching of the amorphous carbon layer 106. In contrast, in the first preferred embodiment of the present invention shown in FIG. 2, the SiC layer 112 has a lower pinhole density than the pinhole density of the SiON layer 108 shown in FIG. 1. Thus, as a result, contamination of the photoresist pattern 110 by components of the amorphous carbon layer 106 is advantageously reduced. Furthermore, undesired etching of the amorphous carbon layer 106 due to etchant passing through the pinhole defects is also advantageously reduced due to the lower pinhole density of the SiC layer 112.

Figure 3:
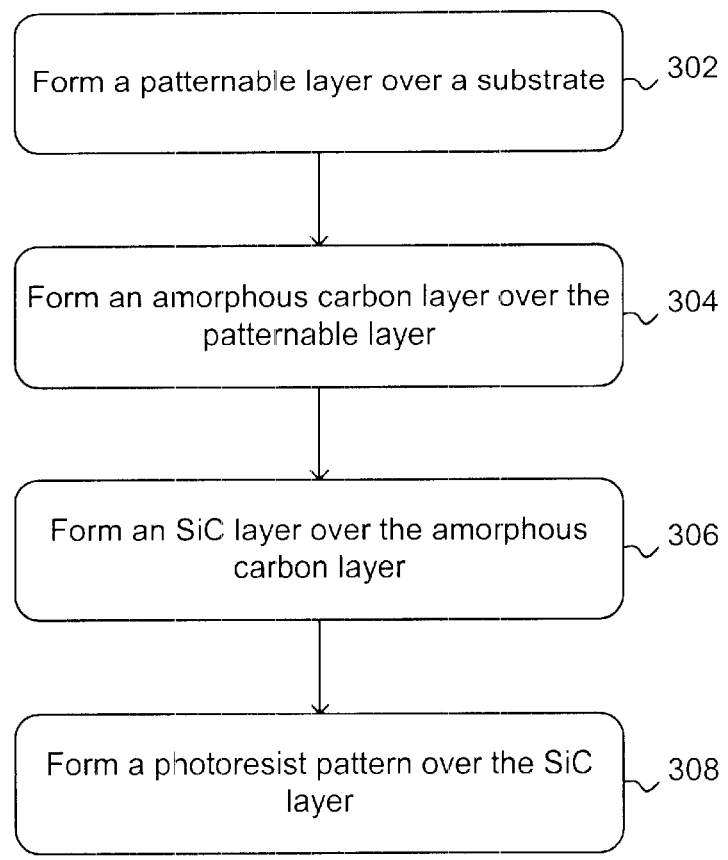
FIG. 3 shows a process flow diagram encompassing the first preferred embodiment and alternative embodiments.

FIG. 3 shows a process flow encompassing the first preferred embodiment and various alternative embodiments. Initially a patternable layer is formed over a substrate (302). An amorphous carbon layer is then formed over the patternable layer (304). A SiC layer is then formed over the amorphous carbon layer (306). Subsequently a photoresist pattern is formed over the SiC layer (308).

Figure 4:
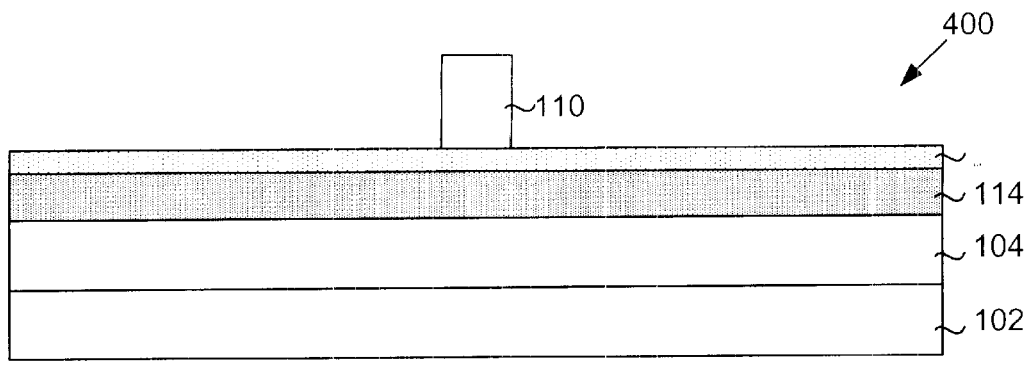
FIG. 4 illustrates a cross-section view of a semiconductor device employing a multi-layered anti-reflective coating having a SiON layer deposited over a SiC layer in accordance with a second preferred embodiment of the invention.

A second preferred embodiment of the present invention is illustrated by the semiconductor device 400 shown in FIG. 4. A polysilicon layer 104 is formed over a substrate 102. The polysilicon layer 104 has a CTE of 2.9 ppm/deg. C. A multi-layered anti-reflective coating is formed over the polysilicon layer 104. During subsequent stages of the semiconductor device fabrication process, the multi-layered anti-reflective coating is used both as a hard mask and as a bottom anti-reflective layer for photolithography. The multi-layered anti-reflective coating includes a SiC layer 114 formed over polysilicon layer 104. The multi-layered anti-reflective coating further includes a SiON layer 116 formed over the SiC layer 114. A photoresist pattern 110 to be used in the photolithographic patterning process is formed over the SiON layer 116.

Thus, the embodiment of the invention shown in FIG. 4 stands in contrast to the method discussed above in relation to FIG. 1. In semiconductor device 100 (shown in FIG. 1), there exists a large compressive stress in the amorphous carbon layer 106 that results from large differences in CTE between the amorphous carbon layer 106 and the polysilicon layer 104 when a narrow line is patterned in the amorphous carbon layer. As a result, the amorphous carbon layer 106 may delaminate from the polysilicon layer 104 and take on a deformed shape. Thus, when the amorphous carbon layer 106 is subsequently used as a hard mask to pattern the polysilicon layer 104, the deformed pattern may be transferred to the polysilicon layer 104. In contrast, in the embodiment of the present invention shown in FIG. 4, the SiC layer 114 has a CTE that is closer to the CTE of the polysilicon layer 104 than is the CTE of amorphous carbon. In particular, the CTEs of the materials are amorphous carbon 3.7; SiC: 3.3; polysilicon 2.9. As a result, in the present embodiment, compressive stress is reduced in the SiC layer 114 due to a closer match between the CTEs of the SiC layer 114 and the polysilicon layer 104 and, therefore, deformation of the SiC layer 114 will advantageously be reduced. Thus, there may be less deformation of the pattern transferred to the polysilicon layer 104 as a result.

Figure 5:
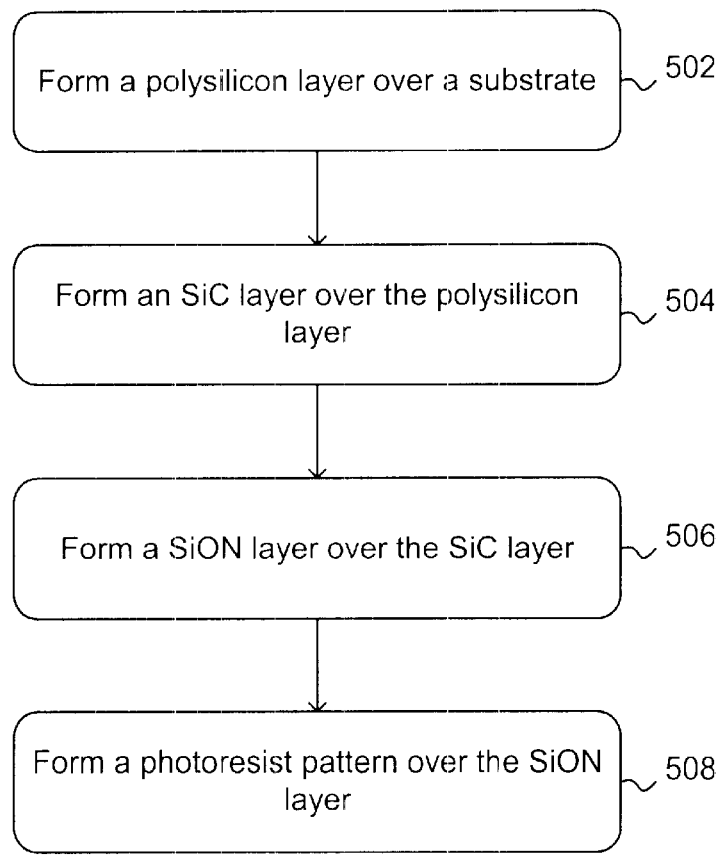
FIG. 5 shows a process flow diagram encompassing the second preferred embodiment and alternative embodiments.

FIG. 5 shows a process flow encompassing the second preferred embodiment and alternative embodiments. Initially a polysilicon layer is formed over a substrate (502). Then a SiC layer is formed over the polysilicon layer (504). A SiON layer is then formed over the SiC layer (506). Subsequently a photoresist pattern is formed over the SiON layer (508).

Figure 6:
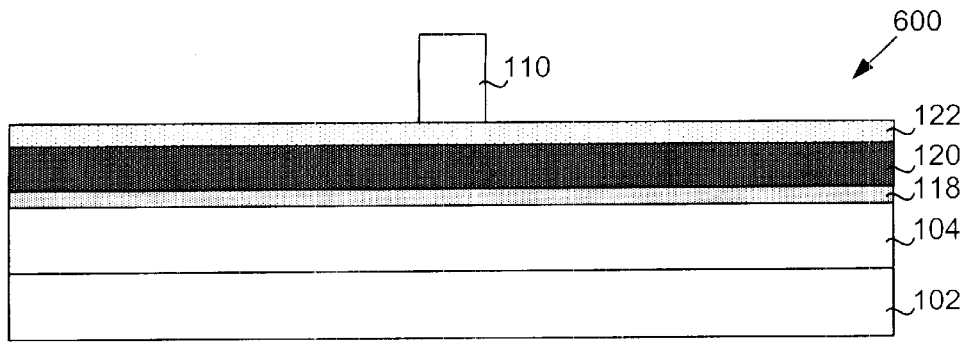
FIG. 6 illustrates a cross-section view of a semiconductor device employing a multi-layered anti-reflective coating having a SiC buffer layer, an amorphous carbon layer and a third layer deposited on the amorphous carbon layer in accordance with a third preferred embodiment.

A third preferred embodiment of the present invention is illustrated by the semiconductor device 600 shown in FIG. 6. A polysilicon layer 104 is formed over a substrate 102. A multi-layered anti-reflective coating is formed over the polysilicon layer 104. During subsequent stages of the semiconductor device fabrication process, the multi-layered anti-reflective coating is used as both a hard mask and as a bottom anti-reflective layer for photolithography. The multi-layered anti-reflective coating includes a SiC thermal expansion buffer layer 118. The multi-layered anti-reflective coating further includes an amorphous carbon layer 120 formed over the SiC thermal expansion buffer layer 118. The multi-layered anti-reflective coating further includes a third layer 122 formed over the amorphous carbon layer 120. The material used in the third layer 122 may be SiON. As an alternative, the third layer may comprise an additional SiC layer in order to obtain the advantages of lower pinhole density, as described above in relation to the first preferred embodiment. A photoresist pattern 110 to be used in the photolithographic patterning process is formed over the third layer 122.

Thus, the embodiment of the invention shown in FIG. 6 differs from the method discussed above in relation to FIG. 1 in that before an amorphous carbon layer 120 is deposited, a SiC thermal expansion buffer layer 118 is deposited on the polysilicon layer 104. The SiC thermal expansion buffer layer 118 has a CTE that is closer to the CTE of the polysilicon layer 104 than is the CTE of amorphous carbon, as discussed with respect to the preceding embodiment. The amorphous carbon layer 120 is then deposited over the SiC thermal expansion buffer layer 118. A cap layer 122 is formed over the amorphous carbon layer 120. The cap layer 122 may be a SiON layer or an additional SiC layer, depending on the application. A photoresist pattern 110 is formed over the cap layer 122.

In the embodiment of the present invention shown in FIG. 6, the problems resulting from the large differences in the CTE between the amorphous carbon layer 120 and the polysilicon layer 104 are reduced by including the SiC thermal expansion buffer layer 118 to separate the polysilicon layer 104 from the amorphous carbon layer 120. Thus, the compressive stress of the amorphous carbon layer 120 is reduced.

In addition, the compressive stress of the SiC thermal expansion buffer layer 118 is likewise reduced due to a closer match between the CTEs of the SiC thermal expansion buffer layer 118 and the polysilicon layer 104.

Therefore, deformation of the SiC thermal expansion buffer layer 118 will advantageously be reduced. Thus, the amorphous carbon layer 120 will be less likely to be pushed away from the SiC thermal expansion buffer layer 118 due to compressive stress and there may be less deformation of the pattern transferred to the polysilicon layer. When the third layer 122 is an SiC layer, it has the further advantages of a lower pinhole density, including reduced contamination of the photoresist pattern 110 by components of the amorphous carbon layer 120 and reduced etching of the amorphous carbon layer 120 due to etchant passing through the pinhole defects.

While it is preferred to use SiC as the material of the thermal expansion buffer layer 118 of the third preferred embodiment, alternative materials having appropriate CTEs, such as SiCOH, may also be employed.

Figure 7:
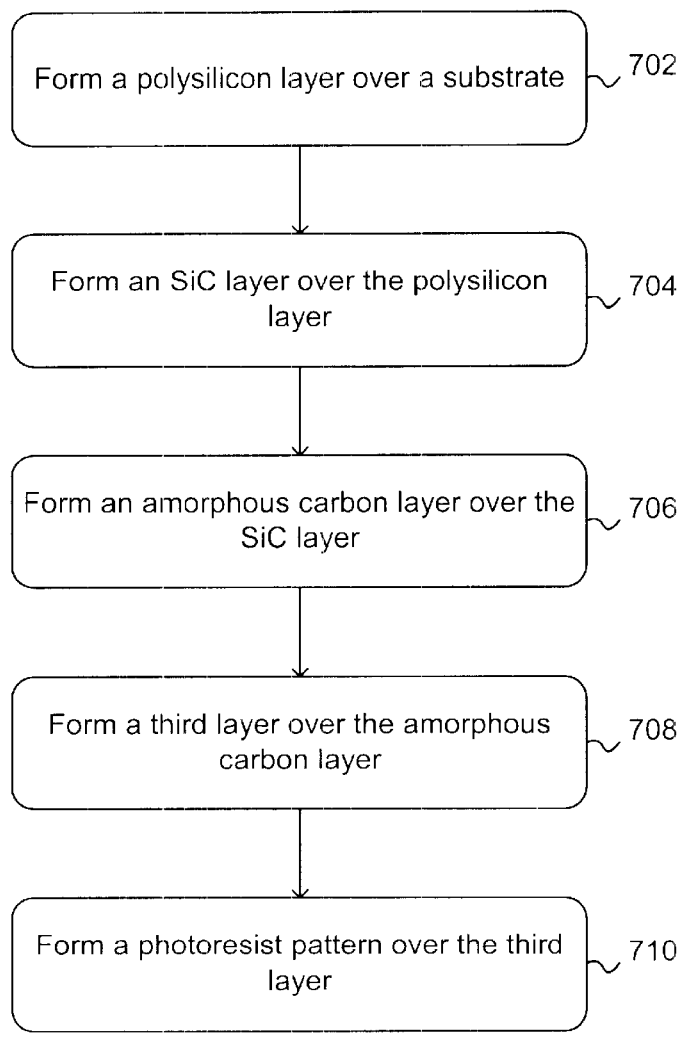
FIG. 7 shows a process flow diagram encompassing the third preferred embodiment and alternative embodiments.

FIG. 7 shows a process flow diagram illustrating the third preferred embodiment of the present invention. Initially a polysilicon layer is formed over a substrate (702). Next, a SiC layer is formed over the polysilicon layer (704). An amorphous carbon layer is then formed over the SiC layer (706). Subsequently, a third layer is formed over the amorphous carbon layer (708). A photoresist pattern is then formed over the third layer (710).

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A semiconductor structure having a multi-layered anti-reflective coating, the semiconductor device comprising:
    a patternable layer formed over a substrate;
    an amorphous carbon layer of the anti-reflective coating formed over the patternable layer;
    a silicon carbide layer of the anti-reflective coating formed over the amorphous carbon layer; and
    a photoresist pattern formed over the silicon carbide layer.

2. The semiconductor structure in claim 1, wherein the silicon carbide layer has a lower pinhole density than the pinhole density of a silicon oxynitride layer.

3. The semiconductor structure recited in claim 1, wherein the patternable layer is a polysilicon layer.

* * * * *